(12) United States Patent
Zhang et al.

(10) Patent No.: US 11,482,634 B1
(45) Date of Patent: Oct. 25, 2022

(54) PHOTOVOLTAIC CELL, METHOD FOR MANUFACTURING SAME AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Bike Zhang, Zhejiang (CN); Xinyu Zhang, Zhejiang (CN); Jingsheng Jin, Zhejiang (CN)

(73) Assignees: ZHEJIANG JINKO SOLAR CO., LTD., Haining (CN); JINKO SOLAR CO., LTD., Jiangxi (CN)

(*) Notice: Subject to any disclaimer, the term of this patent is extended or adjusted under 35 U.S.C. 154(b) by 0 days.

(21) Appl. No.: 17/325,190

(22) Filed: May 19, 2021

(30) Foreign Application Priority Data

Apr. 26, 2021 (CN) .......................... 202110454156.7

(51) Int. Cl.
*H01L 31/068* (2012.01)
*H01L 31/18* (2006.01)

(52) U.S. Cl.
CPC ........ *H01L 31/068* (2013.01); *H01L 31/1868* (2013.01)

(58) Field of Classification Search
CPC .......................... H01L 31/068; H01L 31/1868
See application file for complete search history.

(56) References Cited

U.S. PATENT DOCUMENTS

| 5,871,826 A * | 2/1999 | Mei ........................ H01L 21/22 257/E21.135 |
| 9,847,437 B1 | 12/2017 | You |
| 2012/0186649 A1* | 7/2012 | Turner ............ H01L 31/022425 257/E31.001 |
| 2014/0273338 A1* | 9/2014 | Kumar .................. H01L 31/049 438/98 |

(Continued)

FOREIGN PATENT DOCUMENTS

| CN | 104638033 A | 5/2015 |
| EP | 2325848 A2 | 5/2011 |
| JP | H11312813 A | 11/1999 |

(Continued)

OTHER PUBLICATIONS

Joonwichien, et al. IEEE Journal of Photovoltaics 8.1 (2017): 54-58. (Year: 2017).*

(Continued)

*Primary Examiner* — Sadie White
(74) *Attorney, Agent, or Firm* — USCH Law, PC

(57) ABSTRACT

Embodiments of the present disclosure provide a photovoltaic cell, a method for manufacturing the photovoltaic cell, and a photovoltaic module. The photovoltaic cell includes a substrate, and an emitter and a first passivation structure that are located on a first surface of the substrate, where the emitter is located between the substrate and the first passivation structure; a first electrode, penetrating through the first passivation structure and being in contact with the emitter; and a first eutectic, located between the first electrode and the emitter, where the first eutectic includes a (Continued)

material of the first electrode and a material of the emitter, and a part of the first electrode penetrates through the first eutectic and is in contact with the emitter.

11 Claims, 6 Drawing Sheets

(56) References Cited

U.S. PATENT DOCUMENTS

2014/0318612 A1* 10/2014 Chou ............... H01L 31/02167
438/71

FOREIGN PATENT DOCUMENTS

| JP | 2011103301 A | 5/2011 |
|----|--------------|--------|
| JP | 2012094518 A | 5/2012 |
| JP | 5019397 B2 | 9/2012 |
| JP | 2016103642 A | 6/2016 |
| KR | 20130063266 A | 6/2013 |
| KR | 20130065446 A | 6/2013 |
| TW | 1525642 B | 3/2016 |

OTHER PUBLICATIONS

Hilali, et al., Journal of the Electrochemical Society, 2005, vol. 152, G724-G749 (Year: 2005).*
Hilali, et al., IEEE Transactions on Electron Devices, 2004, vol. 51, No. 6, pp. 948-955 (Year: 2004).*
Heinz, et al. Solar Energy Materials and Solar Cells, 2014, vol. 131, pp. 105-109 (Year: 2014).*
Lago, et al. Prog. Photovolt: Res. Appl., 2010; 18: 20-27 (Year: 2010).*
Joonwichien, et al., 2020 47th IEEE Photovoltaic Specialists Conference (PVSC), IEEE, 2020 (Year: 2020).*
Fangsuwammarak, et al., Key Engineering Materials, 2013, vol. 547, pp. 31-40 (Year: 2013).*
Woehl, et al., IEEE Electron Device Letters, 2011, vol. 32, No. 3, pp. 345-347 (Year: 2011).*
Zhejiang Jinko Solar Co., Ltd., et al., Extended European Search Report, EP 21174442.0, Sep. 9, 2021, 10 pgs.
Zhejiang Jinko Solar Co., Ltd., et al., "Notice of reasons for refusal" and English translation thereof, JP2021-084934, Aug. 31, 2021, 14 pgs.

* cited by examiner

PHOTOVOLTAIC CELL, METHOD FOR MANUFACTURING SAME AND PHOTOVOLTAIC MODULE

CROSS-REFERENCE TO RELATED APPLICATION

The present application claims the benefit of priority to Chinese Patent Application No. 202110454156.7 filed on Apr. 26, 2021, which is incorporated herein by reference in its entirety.

TECHNICAL FIELD

Embodiments of the present disclosure relate to a photovoltaic technique, in particular to a photovoltaic cell, a method for manufacturing the photovoltaic cell and a photovoltaic module.

BACKGROUND

Generally, for a photovoltaic cell, a front electrode is formed by a screen printing process to coat a conductive paste on a surface of a passivation layer and a sintering process to penetrate the conductive paste through the passivation layer so as to form an ohmic contact with an emitter.

It is showed that there are a large number of voids between the front electrode and a substrate due to an uncontrollability of conductive material precipitation in the process of sintering. The existence of the voids may decrease an area of a contact region between the front electrode and a substrate surface, thus weakening a current-collecting capability of the front electrode. Meanwhile, the existence of the voids may also increase surface defects of the front electrode, thus improving a carrier interface recombination rate.

SUMMARY

Some embodiments of the present disclosure provide a photovoltaic cell, a method for manufacturing the photovoltaic cell and a photovoltaic module, which are beneficial to improving the photoelectric conversion efficiency of the photovoltaic module.

In order to solve the above problems, some embodiments of the present disclosure provide a photovoltaic cell, including: a substrate, and an emitter and a first passivation structure that are located on a first surface of the substrate, where the emitter is located between the substrate and the first passivation structure; a first electrode, penetrating through the first passivation structure and being in contact with the emitter; and a first eutectic, located between the first electrode and the emitter, where the first eutectic includes a material of the first electrode and a material of the emitter, and a part of the first electrode penetrates through the first eutectic and is in contact with the emitter.

In some embodiments, the first electrode includes a first crystal structure and a second crystal structure, where the second crystal structure is a derived structure of the first crystal structure, the first eutectic is at least partially located between the emitter and the first crystal structure, and the second crystal structure penetrates through the first eutectic and is in contact with the emitter.

In some embodiments, a part of the first crystal structure is located in the emitter, and the second crystal structure is a derived structure of the part of the first crystal structure located in the emitter.

In some embodiments, the first electrode further includes a glass frit layer, where the glass frit layer is located between the emitter and the first crystal structure, a part of the first crystal structure is located in the glass frit layer, the first eutectic is located between the glass frit layer and the emitter, and the second crystal structure sequentially penetrates through the glass frit layer and the first eutectic and is in contact with the emitter.

In some embodiments, the first electrode further includes a glass frit layer, where the glass frit layer is located between the emitter and the first crystal structure, a part of the first crystal structure is located in the glass frit layer, the first eutectic is located only on one side of the emitter, a bottom surface of the first crystal structure is in contact with the first eutectic, and the second crystal structure extends from the bottom surface of the first crystal structure to penetrate through the first eutectic and is in contact with the emitter without penetrating through the glass frit layer.

In some embodiments, the first crystal structure includes a plurality of protrusion portions with one or more voids between adjacent protrusion portions, where the second crystal structure fills the one or more voids between the adjacent protrusion portions.

In some embodiments, a morphology of the second crystal structure includes at least one of a cluster structure, a non-bifurcating single structure and a multi-bifurcating structure.

In some embodiments, the photovoltaic cell further includes: a second passivation structure and a second electrode that are located on a second surface of the substrate, where the second electrode penetrates through the second passivation structure and is electrical connected to the substrate.

In some embodiments, the photovoltaic cell further includes: a second eutectic, located between the second electrode and the substrate, where the second eutectic includes a material of the second electrode and a material of the substrate; where the second electrode includes a third crystal structure and a fourth crystal structure, where the fourth crystal structure is a derived structure of the third crystal structure, the second eutectic is located between the third crystal structure and the substrate, and the fourth crystal structure penetrates through the second eutectic and is in contact with the substrate.

In some embodiments, the second passivation structure includes an aluminum oxide layer and a hydrogen-doped silicon nitride layer that are arranged in sequence, and the second electrode penetrates through the hydrogen-doped silicon nitride layer and the aluminum oxide layer in sequence and is in contact with the substrate.

In some embodiments, the second passivation structure includes an interface passivation layer, a field passivation layer and an anti-reflective layer that are arranged in sequence, and the second electrode penetrates through the anti-reflective layer and extends into the field passivation layer to be in contact with the field passivation layer and be electrically connected to the substrate.

In some embodiments, a second eutectic, located between the second electrode and the field passivation layer, where the second eutectic includes a material of the second electrode and a material of the field passivation layer; where the second electrode includes a third crystal structure and a fourth crystal structure, where the fourth crystal structure is a derived structure of the third crystal structure, the second eutectic is located between the third crystal structure and the field passivation layer, and the fourth crystal structure penetrates through the second eutectic and is in contact with the field passivation layer.

Some embodiments of the present disclosure further provide a photovoltaic module, including: a cell string, formed by connecting a plurality of photovoltaic cells described in any one of the above; an encapsulation film, configured to cover a surface of the cell string; and a cover plate, configured to cover a surface of the encapsulation film facing away from the cell string.

Some embodiments of the present disclosure further provide a method for manufacturing a photovoltaic cell, including: providing a substrate, an emitter and a first passivation structure that are sequentially arranged on a first surface of the substrate; and forming a first electrode, wherein the first electrode penetrates through the first passivation structure and is in contact with the emitter, a material of part of the first electrode is mixed with a material of part of the emitter to form a first eutectic, the first eutectic is located between the first electrode and the emitter, and a part of the first electrode penetrates through the first eutectic and is in contact with the emitter.

In some embodiments, the forming the first electrode includes: sintering a conductive paste to form a first crystal structure of the first electrode, where the first crystal structure penetrates through the first passivation structure and is in contact with the emitter, the material of part of the first electrode and the material of part of the emitter material that are in contact form the first eutectic, and the first eutectic is located between the first crystal structure and the emitter; and applying a pulse voltage to the first crystal structure by an external power supply to form a second crystal structure derived from the first crystal structure, where the second crystal structure penetrates through the first eutectic and is in contact with the emitter, and the first crystal structure and the second crystal structure constitute the first electrode.

In some embodiments, before forming the second crystal structure, a part of the first crystal structure is located in the emitter, and the second crystal structure is a derived structure of the part of the first crystal structure located in the emitter.

In some embodiments, the pulse voltage includes at least one of a triangular wave pulse voltage, a rectangular wave pulse voltage, a sawtooth wave pulse voltage and a triangular function wave pulse voltage.

In some embodiments, the method for manufacturing the photovoltaic cell further includes: forming a second electrode and a second passivation structure, where the second passivation structure is located on a second surface of the substrate, and the second electrode penetrates through the second passivation structure and is electrically connected to the substrate.

In some embodiments, the first electrode and the second electrode is rapidly sintered by an infrared-chain sintering furnace.

In some embodiments, the conductive paste consists of an organic vehicle, a conductive particle and a glass frit.

BRIEF DESCRIPTION OF THE DRAWINGS

One or more embodiments are described as examples with reference to the corresponding figures in the accompanying drawings. The figures in the accompanying drawings do not constitute a proportion limitation unless otherwise stated.

DETAILED DESCRIPTION

The embodiments of the present disclosure will be described in detail below with reference to the accompanying drawings in order to make the objectives, technical solutions and advantages of the present disclosure clearer. However, it will be appreciated by those of ordinary skill in the art that, in various embodiments of the present disclosure, numerous technical details are set forth in order to provide the reader with a better understanding of the present disclosure. However, the technical solutions claimed in the present disclosure may be implemented without these technical details and various changes and modifications based on the following embodiments.

Figure 1:
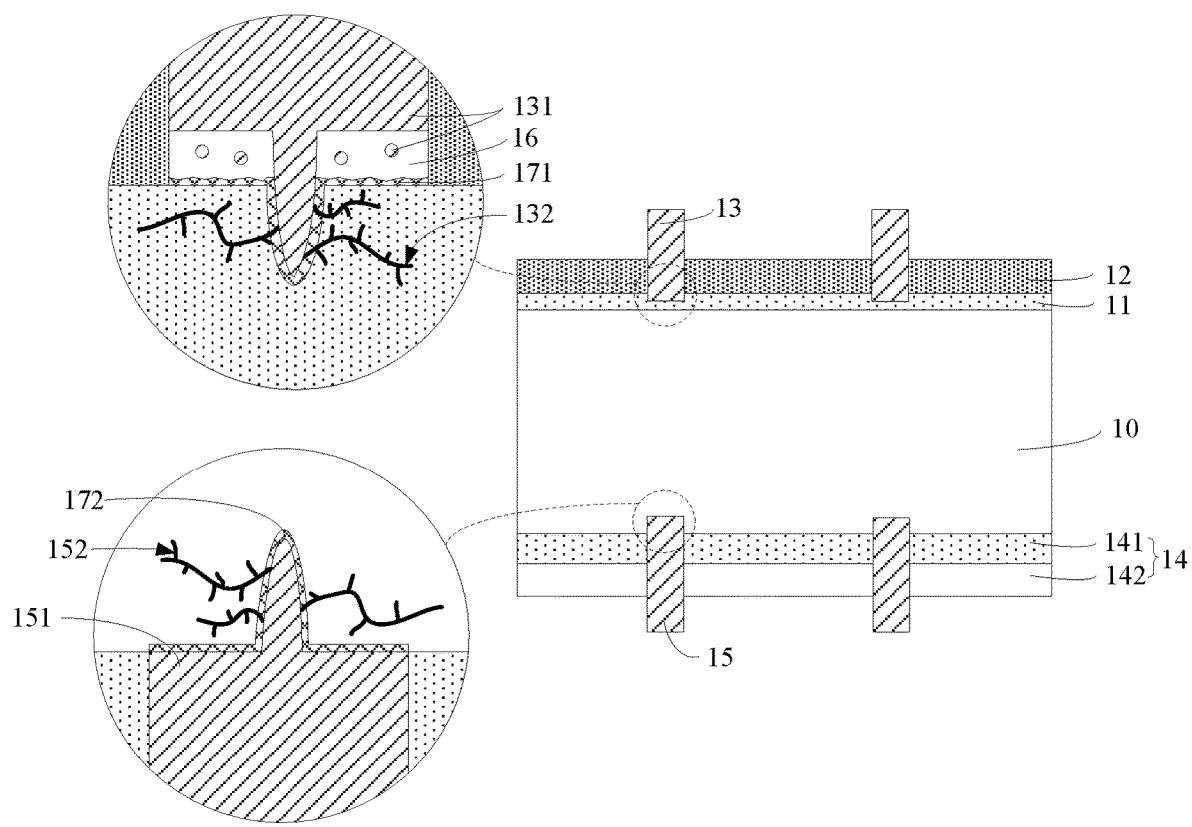
FIGS. 1 to 6 are schematic structural diagrams of a photovoltaic cell provided in embodiments of the present disclosure.
Figure 2:
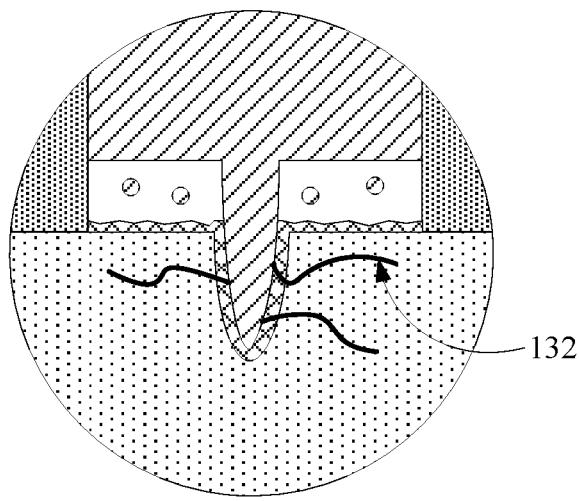
Figure 3:
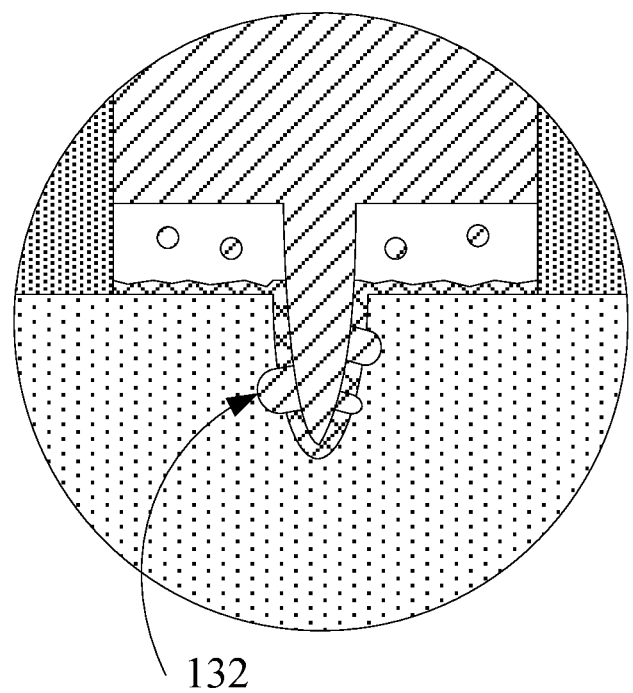

Referring to FIG. 1, a photovoltaic cell includes a substrate 10, an emitter 11 and a first passivation structure 12 that are located on a first surface of the substrate 10, a first electrode 13 and a first eutectic 171. The emitter 11 is located between the substrate 10 and the first passivation structure 12. The first electrode 13 penetrates through the first passivation structure 12 and is in contact with the emitter 11. The first eutectic 171 is located between the first electrode 13 and the emitter 11 and includes a material of the first electrode 13 and a material of the emitter 11. A part of the first electrode 13 penetrates through the first eutectic 171 and is in contact with the emitter 11.

It should be noted that multiple implementable photovoltaic structures are included in the present disclosure, and the structure of the photovoltaic cell shown in FIG. 1 is merely one of the embodiments. The structure shown in FIG. 1 is taken as an example to describe common features of multiple embodiments, and the structures shown in FIGS. 2 to 6 describe differences between the multiple embodiments. In addition, for the sake of conciseness, textured surfaces of the substrate 10 and the emitter 11 are not shown in FIG. 1.

The substrate 10 has a first surface and a second surface opposite to the first surface. In some embodiments, the first surface is designated as a light-receiving surface, and the second surface is a substrate surface opposite to the first surface. In some embodiments, the first surface of the substrate 10 is referred to as a front surface, and the second surface of the substrate 10 is referred to as a rear surface. For a mono-facial cell, the first surface is the light-receiving surface and the second surface is a backlight surface. For a bi-facial cell, both the first surface and the second surface may be the light-receiving surfaces.

In some embodiments, a material of the substrate 10 is a silicon material, which may include one or more of monocrystalline silicon, polycrystalline silicon, amorphous silicon and microcrystalline silicon. In other embodiments, the material of the substrate may also be a carbon simple substance, an organic material or a multinary compound. The multinary compound may include, but are not limited to, perovskite, gallium arsenide, cadmium telluride, copper indium selenium, etc.

The substrate 10 forms a PN junction with the emitter 11. For example, if the substrate 10 includes a P-type doping element (such as boron, gallium, etc.), the emitter 11 includes an N-type doping element (such as phosphorus, arsenic, etc.). If the substrate 10 includes the N-type doping element, the emitter 11 includes the P-type doping element. In some embodiments, the emitter 11 may be regarded as a part of the substrate 10. In addition, the surface of the emitter 11 may be set as a pyramid textured surface to reduce the reflection of light on the surface of the emitter 11, thus increasing an absorption and utilization rate of the light and improving the conversion efficiency of the photovoltaic cell.

A film structure and a film material of the first passivation structure 12 may be adjusted according to actual needs, for example, according to a cell type of the photovoltaic cell. For example, the photovoltaic cells may include a passivated emitter and rear cell (PERC), a tunnel oxide passivated contact (TOPCON) cell, etc. Here, the PERC cell is taken as an example for description. The first passivation structure 12 may be a single-layer structure or a multi-layer structure sequentially arranged in a direction perpendicular to the surface of the substrate 10. A conventional first passivation structure may include a silicon nitride single-layer structure, an aluminum oxide/silicon nitride double-layer laminate structure or a silicon nitride-silicon oxynitride-silicon nitride multi-layer laminate structure. The number of films in the multi-layer laminate structure may be greater than or equal to 3. In some embodiments, the first passivation structure 12 may further include a silicon dioxide layer formed on the surface of the emitter 11.

The material of the first electrode 13 may be adjusted according to actual needs. The first electrode 13 may include a silver electrode, an aluminum electrode, a silver-aluminum electrode, etc. Accordingly, the material of the first eutectic 171 may be adjusted according to both the material of the first electrode 13 and the material of the emitter 11. Herein, the first electrode 13 includes the silver electrode, the material of the emitter 11 is silicon and the first eutectic 171 is a silver silicon eutectic, all of which are illustrated as an example.

The first electrode 13 further includes a glass frit layer 16 located between the first passivation structure 12 and the emitter electrode 11. The first electrode 13 (i.e. the silver electrode) may be divided into an agglomerate electrode (sintered silver electrode), silver nanoparticles and silver microcrystals. The agglomerate electrode is located at a side of the glass frit layer 16 away from the emitter 11 and extends into the glass frit layer 16, or, penetrates through the glass frit layer 16 and extends into the emitter 11. The silver nanoparticles are located in the glass frit layer 16, and the silver microcrystals (not shown) are located between the glass frit layer 16 and the first eutectic 171. In the process of forming the first electrode 13, some silver atoms precipitated on the surface of the emitter 11 are mixed with the material of the emitter 11 to form the first eutectic 171, while the other part of the first electrode 13 does not participate in the mixing and remains in the form of the silver microcrystals after being completely cooled. That is, the first eutectic 171 is located not only between the emitter 11 and the agglomerate electrode, but also between the glass frit layer 16 and the emitter 11.

Herein, a material of the glass frit layer 16 is a glass material which may include at least one of metallic glass particles, tellurium-containing glass particles, lead-containing glass particles and lead-free glass particles. The commonly used glass frit is a lead-containing glass frit. For example, Pb—Al—B—SiO2 is one of the commonly used lead-containing glass frits. In addition, Pb—Sn—V—O, Pb—B—V—O, and the like may also be used. There are generally P—Zn—O, V—Ba—P—O, B—V—O, Sn—B—Si—O and Bi—B—Si—O systems in the lead-free glass frit.

In some embodiments, the first electrode 13 includes a first crystal structure 131 and a second crystal structure 132 (schematically represented by thick black lines). The second crystal structure 132 is a derived structure of the first crystal structure 131, which means that the second crystal structure 132 is formed by grain regrowth and recrystallization on the basis of the first crystal structure 131. The glass frit layer 16 is located between the first crystal structure 131 and the emitter 11. The first eutectic 171 is at least partially located between the first crystal structure 131 and the emitter 11. The second crystal structure 132 penetrates through the first eutectic 171 and is in contact with the emitter 11.

A morphology of the second crystal structure 132 as the derived structure includes at least one of a cluster structure, a non-bifurcating single structure and a multi-bifurcating structure. For example, the multi-bifurcating structure (black thick lines) is taken as an example in FIG. 1, the non-bifurcating structure (black thick lines) is taken as an example in FIG. 2, and the cluster structure (filled with diagonal lines) is taken as an example in FIG. 3. It should be noted that the growth of the non-bifurcating structure and the multi-bifurcating structure is usually expressed by an extension length, and the growth of the cluster structure is usually expressed by a bottom radius.

As the derived structure, the arrangement of the second crystal structure 132 is beneficial to filling internal voids of the first crystal structure 131 and voids between the first crystal structure 131 and the emitter 11, thereby reducing the connection resistance between the first crystal structure 131 and the emitter 11, improving the current-collecting capability of the first crystal structure 131 and avoiding the structural stability defect caused by voids of the structures. Meanwhile, the second crystal structure 132 only penetrates through a part of the first eutectic 171 without damaging the first eutectic 171 and other film layer structures. In this way, not only the current may be collected through the second crystal structure 132, but also the arrangement of the second crystal structure 132 may be prevented from damaging adjacent film layers such as the first eutectic 171, thus reducing structural defects (e.g. a stress defect caused by stress concentration and a structural stability defect caused by structural cracks) of the adjacent film layers such as the first eutectic 171. In addition, through extending a length of the second crystal structure 132 or expanding the bottom radius of the second crystal structure 132, an area of a contact region between the first electrode 13 and the emitter 11 may be further increased and an upper limit of the current collected by the first electrode 13 may be increased.

Specifically, in a direction perpendicular to a side wall of the first crystal structure 131, the cluster structure has a height of 0.2 to 2 µm (such as 0.5 µm, 1 µm, 1.5 µm, etc.), a bottom radius of 0.2 to 10 µm (such as 0.5 µm, 1 µm, 4 µm, 7 µm, etc.) and a crystal structure of a hemispherical particle composed of (111) planes, (200) planes, (220) planes, (311) planes, (222) planes and other crystal planes. The non-bifurcating single structure has a diameter of 20 to 200 nm (such as 50 nm, 100 nm, 150 nm, etc.), a length of 0.2 to 5 µm (such as 0.5 µm, 0.8 µm, 1.2 µm, 3 µm, etc.), and a crystal structure with main crystal planes of (110) planes and other crystal planes. The X-ray diffraction (XRD) signal intensities of the other crystal planes are less than 5% of that of the main crystal planes. A main bifurcation structure and the crystal planes of the multi-bifurcating structure are the same as that of the non-bifurcating structure. A secondary bifurcation structure formed on the basis of the main bifurcation structure has a diameter of 10 to 50 nm (such as 15 nm, 30 nm, 35 nm, etc.) and a length of 0.1 to 1 µm (such as 0.2 µm, 0.4 µm, 0.6 µm, 0.8 µm, etc.). A crystal structure of the secondary bifurcation structure is the same as a crystal structure of the main bifurcation structure.

It should be noted that the main reason for the (110) plane being the main crystal plane in a nanowire structure is that a growth rate of the (110) plane is much higher than that of other crystal planes in the absence of further surfactants.

In some embodiments, a part of the first crystal structure 131 is located in the emitter 11, and the second crystal structure 132 is a derived structure of the part of the first crystal structure 131 located in the emitter 11. Since the second crystal structure 132 is the derived structure of the part of the first crystal structure 131 located in the emitter 11, other parts of the second crystal structure 132 in addition to the part penetrating through the first eutectic 171 may be in contact with the emitter 11. In this way, it is beneficial to increase the contact surface between the first electrode 13 and the emitter 11, thus improving the current-collecting capability of the first electrode 13. And it is also beneficial to reduce requirements on the extension length or the bottom radius of the second crystal structure 132 and the quantity of the second crystal structure 132, thus reducing the structural complexity.

It should be noted that FIG. 1 only illustrates one protrusion portion of the first crystal structure 131, which penetrates through the glass frit layer 16 and extends into the emitter 11. In fact, the first crystal structure 131 has a plurality of protrusion portions with one or more voids between adjacent protrusion portions, and the second crystal structure 132 may fill the voids between the adjacent protrusion portions. In this way, it is beneficial to reduce the influence of the second crystal structure 132 on structural characteristics of adjacent film layers. Furthermore, the structural stability of the photovoltaic cell may be improved by filling the voids, the area of the contact region between the first electrode 13 and the emitter 11 may be increased, and the current-collecting capability of the first electrode 13 may be improved, thus improving the photoelectric conversion efficiency of the photovoltaic cell.

Figure 4:
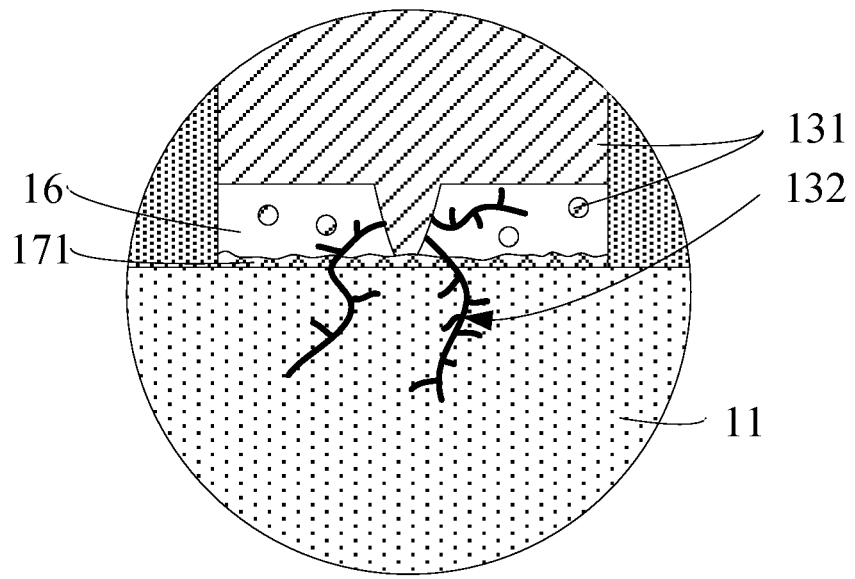

In some embodiments, as shown in FIG. 4, a part of the first crystal structure 131 is located in the glass frit layer 16, the first eutectic 171 is located between the glass frit layer 16 and the emitter 11, and the second crystal structure 132 sequentially penetrates through the glass frit layer 16 and the first eutectic 171 and is in contact with the emitter 11. In this way, it is beneficial to reduce the requirement on a cauterization depth of the first crystal structure 131, thus reducing the structural complexity of the photovoltaic cell. Meanwhile, it is beneficial to reduce an internal defect caused by the cauterization depth being excessively large and the recombination of carriers caused by the internal defect, thus improving the photoelectric conversion efficiency of the photovoltaic cell.

Figure 5:
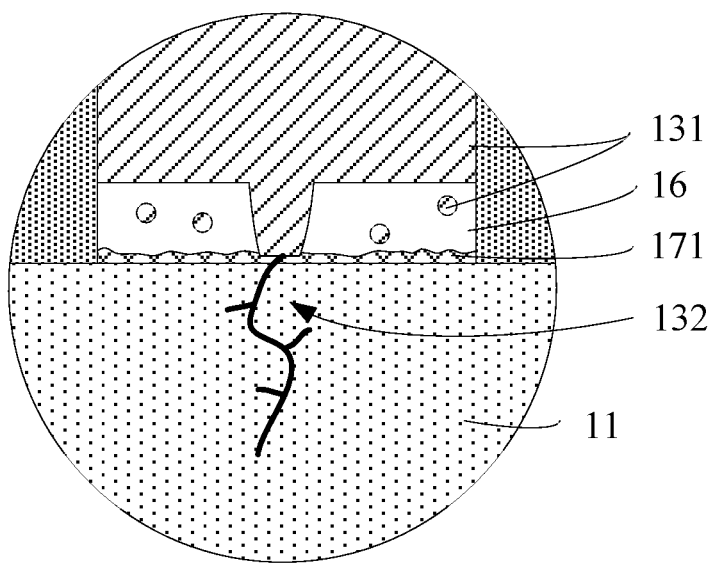

It should be noted that even if the first crystal structure 131 penetrates through the glass frit layer 16 and extends into the emitter 11, the second crystal structure 132 may still be the derived structure on the basis of the first crystal structure 131 located in the glass frit layer 16. In some embodiments, as shown in FIG. 5, the first eutectic 171 is located only on one side of the emitter 11. A bottom surface of the first crystal structure 131 is in contact with the first eutectic 171. The second crystal structure 132 extends from the bottom surface of the first crystal structure 131 to penetrate through the first eutectic 171 and be in contact with the emitter 11, without penetrating through the glass frit layer 16.

In some embodiments, the photovoltaic cell further includes a second passivation structure 14 and a second electrode 15 that are located on a second surface of the substrate 10. The second electrode 15 penetrates through the second passivation structure 14 and is electrically connected to the substrate 10.

In some embodiments, when the photovoltaic cell is the PERC cell, the second passivation structure 14 includes an aluminum oxide layer 141 and a hydrogen-doped silicon nitride layer 142 that are arranged in sequence, and the second electrode 15 is generally an aluminum electrode. The second electrode 15 penetrates through the hydrogen-doped silicon nitride layer 142 and the aluminum oxide layer 141 in sequence and is in contact with the substrate 10.

In some embodiments, as shown in FIG. 1, the photovoltaic cell further includes a second eutectic 172 located between the second electrode 15 and the substrate 10. The second eutectic 172 includes a material of the second electrode 15 and a material of the substrate 10. The second electrode 15 includes a third crystal structure 151 and a fourth crystal structure 152. The fourth crystal structure 152 is a derived structure of the third crystal structure 151. The second eutectic 172 is located between the third crystal structure 151 and the substrate 10. The fourth crystal structure 152 penetrates through the second eutectic 172 and is in contact with the substrate 10. In this way, it is beneficial to improve the current-collecting capability of the second electrode 15 in the PERC cell, thus improving the photoelectric conversion efficiency of the photovoltaic cell.

Figure 6:
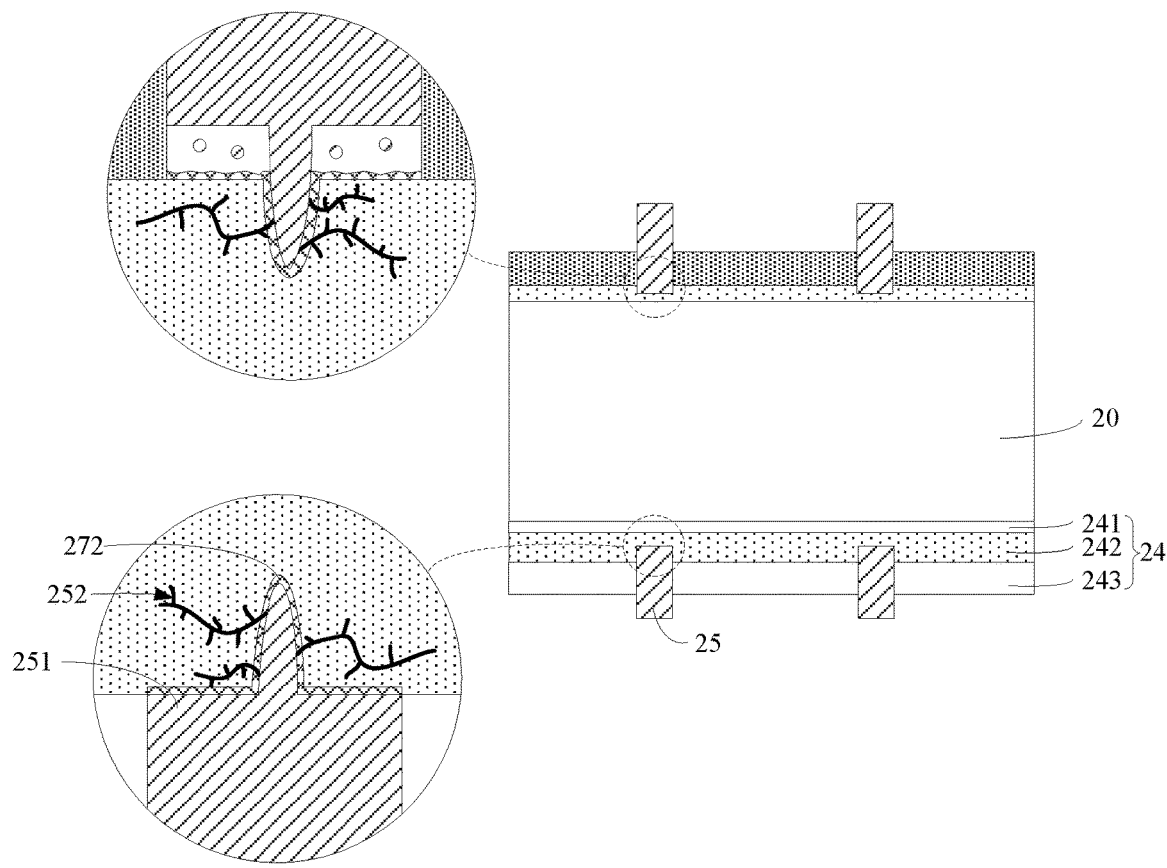

In some embodiments, when the photovoltaic cell is the TOPCON cell, as shown in FIG. 6, the second passivation structure 24 includes an interface passivation layer 241, a field passivation layer 242 and an anti-reflective layer 243 that are arranged in sequence. Generally, a material of the interface passivation layer 241 is silicon dioxide, a material of the field passivation layer 242 is doped polysilicon, and a material of the anti-reflective layer 243 is generally a silicon nitride. The second electrode 25 is generally a silver electrode. The second electrode 25 penetrates through the anti-reflective layer 243 and extends into the field passivation layer 242 to be in contact with the field passivation layer 242 and be electrically connected to the substrate 20.

In some embodiments, the photovoltaic cell further includes a second eutectic 272 located between the second electrode 25 and the field passivation layer 242. The second eutectic 272 includes a material of the second electrode 25 and a material of the field passivation layer 242. The second electrode 25 includes a third crystal structure 251 and a fourth crystal structure 252. The fourth crystal structure 252 is a derived structure of the third crystal structure 251. The second eutectic 272 is located between the third crystal structure 251 and the field passivation layer 242. The fourth crystal structure 252 penetrates through the second eutectic 272 and is in contact with the field passivation layer 242. In this way, it is beneficial to improve the current-collecting capability of the second electrode 25 in the TOPCON cell, thus improving the photoelectric conversion efficiency of the photovoltaic cell.

In this embodiment, a part of the first electrode penetrates through the first eutectic and is in contact with the emitter. Compared with forming an ohmic contact with the substrate through the first eutectic, the first electrode is in a direct contact with the emitter, which is beneficial to reducing a contact resistance between the first electrode and the emitter and improving the current-collecting capability of the first electrode. Meanwhile, carriers may directly reach the first electrode without passing through the first eutectic, which is beneficial to reducing the recombination of carriers caused by surface defects and internal defects of the first eutectic and improving the photoelectric conversion efficiency.

Embodiments of the present disclosure further provide a photovoltaic module, which is configured to convert received light energy to electrical energy. The photovoltaic module includes a cell string, an encapsulation film and a cover plate. The cell string is formed by connecting a plurality of photovoltaic cells, and the photovoltaic cells may be any of the aforementioned photovoltaic cells (including but not limited to the photovoltaic cells shown in FIGS. 1 to 6). The encapsulation film may be an organic encapsulation film such as Ethylene Vinyl Acetate (EVA), Poly Olefin Elastomer (POE), etc., and the encapsulation film covers a surface of the cell string for sealing. The cover plate may be a glass cover plate, a plastic cover plate, etc. The cover plate covers a surface of the encapsulation film facing away from the cell string. In some embodiments, the cover plate is provided with a light trapping structure to increase utilization of incident lights. The photovoltaic module has relatively high current-collecting capacity and relatively low carrier recombination rate, so that the relatively high photoelectric conversion efficiency may be realized.

Figure 7:
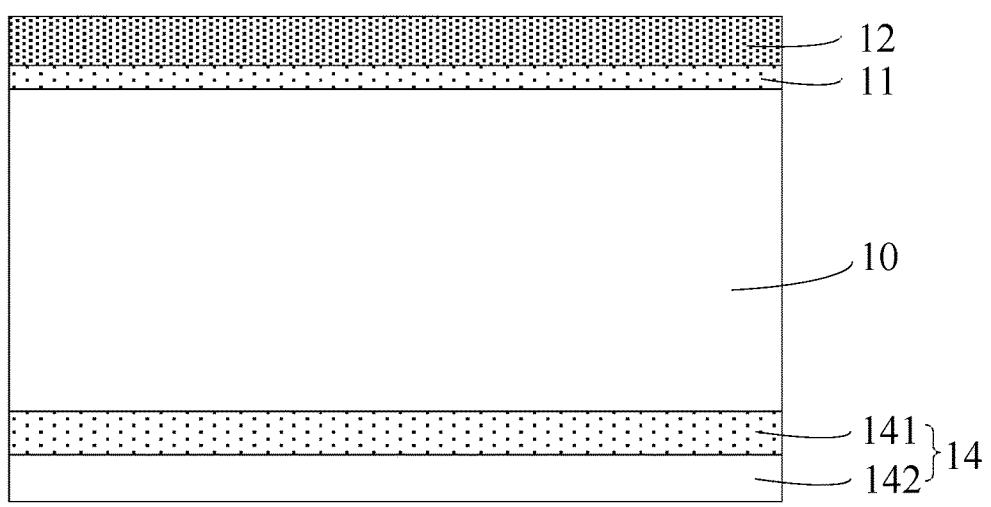
FIGS. 7 to 11 are schematic structural diagrams corresponding to each step of a method for manufacturing the photovoltaic cell provided in embodiments of the present disclosure.
Figure 8:
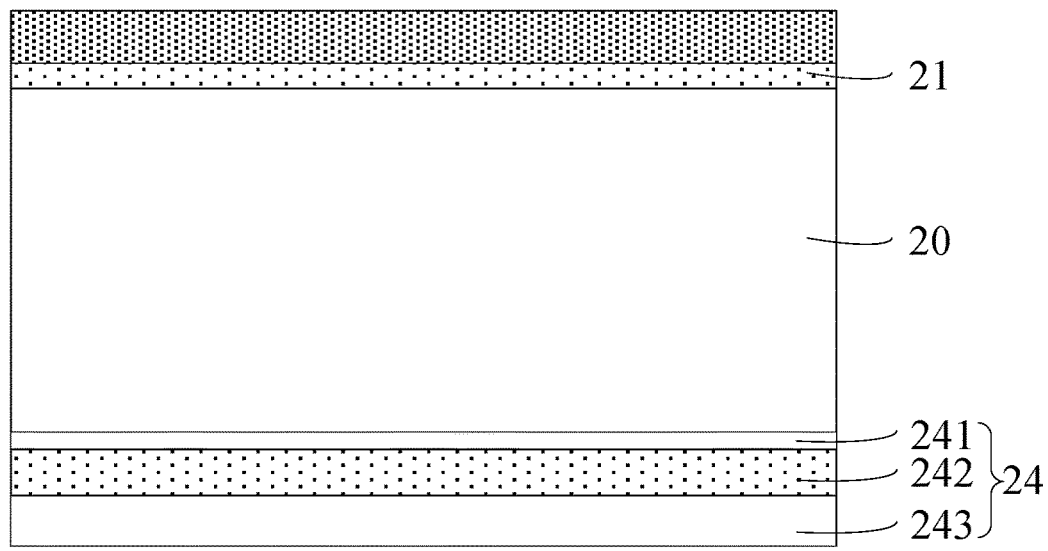

Embodiments of the present disclosure further provide a method for manufacturing the photovoltaic cell. FIGS. 7 to 8 are schematic structural diagrams corresponding to each step of the method for manufacturing the photovoltaic cell provided in the embodiments of the present disclosure. The method for manufacturing the photovoltaic cell includes the following steps.

Referring to FIG. 7, a substrate 10, an emitter 11 and a first passivation structure 12 that are sequentially arranged on a first surface of the substrate 10, and a second passivation structure 14 located on a second surface of the substrate 10 are provided.

Specifically, an N-type or a P-type initial semiconductor substrate is provided. The initial substrate is cleaned, and a pyramid textured surface (not shown) is prepared using wet chemical etching techniques. In addition, the textured surface may be prepared by performing a mature texturing process on the production line such as texturing with alkaline solution to form a 45-degree regular pyramid textured surface.

After double-sided texturing, a first surface of the initial substrate is subjected to a doping element diffusion treatment to form the emitter 11. The emitter 11 occupies part of the surface space on a sun-facing side of the initial substrate, and the rest of the initial substrate serves as the substrate 10. The emitter 11 and the substrate 10 constitute a PN junction.

After the emitter 11 is formed, a planarization process is performed on the second surface of the substrate 10 to form a flat surface for depositing the second passivation structure 14 required.

When the photovoltaic cell is the PERC cell, the initial substrate is P-type, and the second passivation structure 14 generally includes an aluminum oxide layer 141 and a hydrogen-doped silicon nitride layer 142. Herein, the formation of the hydrogen-doped silicon nitride layer 142 generally includes the following two steps. Step 1, depositing to form a silicon nitride layer. Step 2, implanting hydrogen ion into the silicon nitride layer. If the first passivation structure 12 includes the silicon nitride layer, one silicon nitride layer on the first surface and one silicon nitride layer on the second surface may be formed in the same process step. The silicon nitride layer on the first surface is used as the first passivation structure 12 or one of the film layers of the first passivation structure 12, and the silicon nitride layer on the second surface is configured to form the hydrogen-doped silicon nitride layer 142.

When the photovoltaic cell is the TOPCON cell, referring to FIG. 8, the initial substrate is N-type, and the second passivation layer 24 includes an interface passivation layer 241, a field passivation layer 242 and an anti-reflective layer 243 which are sequentially stacked.

When the initial substrate is N-type, a boron element is generally used for diffusion treatment to form a P-type emitter 21. The boron diffusion treatment may also generate unnecessary borosilicate glass on the first surface, the second surface and a side surface of the initial substrate at the same time. The borosilicate glass may have certain protective effects on the emitter 21 and the substrate 20, which may prevent the surfaces of the initial substrate from being damaged by some processes. In other words, the unnecessary borosilicate glass may be used as a protective layer, and the borosilicate glass on the second surface is removed in the planarization process.

When a silicon dioxide layer is used as the interface passivation layer 241, the silicon dioxide may be formed by performing not only a chemical vapor deposition process but also an in-situ generation process on the basis of a silicon substrate. The in-situ generation process includes a thermal oxidation process, a nitric acid passivation process, a natural oxidation process, etc. After the interface passivation layer 241 is formed, an intrinsic polysilicon is deposited on the surface of the interface passivation layer 241, and dopant ions are doped into the intrinsic polysilicon through ion implantation and source diffusion to form a doped polysilicon which is served as the field passivation layer 242. After the field passivation layer 242 is formed, the anti-reflective layer 243 which may be set as the silicon nitride layer is continued to be formed.

Since the first surface of the substrate 20 has the borosilicate glass as a mask layer for protecting when the interface passivation layer 241 and the field passivation layer 242 are formed by the deposition process, it is unnecessary to define a deposition region on the second surface through a mask when performing the deposition process. Subsequently, the same process may be used to simultaneously remove the borosilicate glass on the first surface and the silicon oxide and the polysilicon that are deposited on the first surface. In this way, there is no need to provide an additional mask, which is beneficial to reducing process steps, shortening process flows and reducing process costs.

After the second passivation structure 14 is formed and before the first passivation structure 12 is formed, it is necessary to remove redundant materials plated on the first surface of the emitter 11 to expose the emitter 11. After the emitter 11 is exposed, the first passivation structure 12 is formed according to the type of the cell and actual needs.

Figure 9:
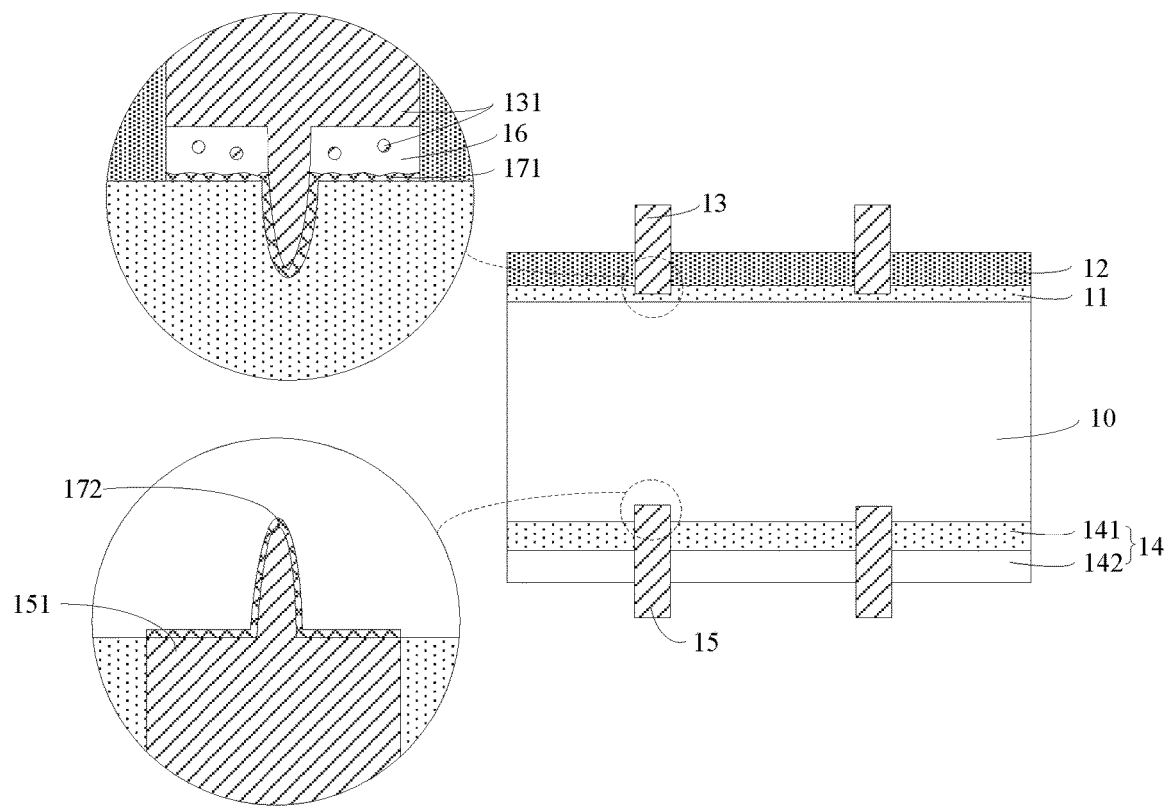

Referring to FIG. 9, a conductive paste is coated and sintered to form a first crystal structure 131 of a first electrode 13 and a third crystal structure 151 of a second electrode 15.

After the first passivation structure 12 and the second passivation structure 14 are formed, a screen printing process may be performed to coat the conductive paste on a surface of the first passivation structure 12 and a surface of the second passivation structure 14. Through performing high temperature sintering on the conductive paste, the first crystal structure 131 penetrating through the first passivation structure 12 and in contact with the emitter 11 is formed, and the third crystal structure 151 electrically connected to the substrate 10 is formed.

Figure 10:
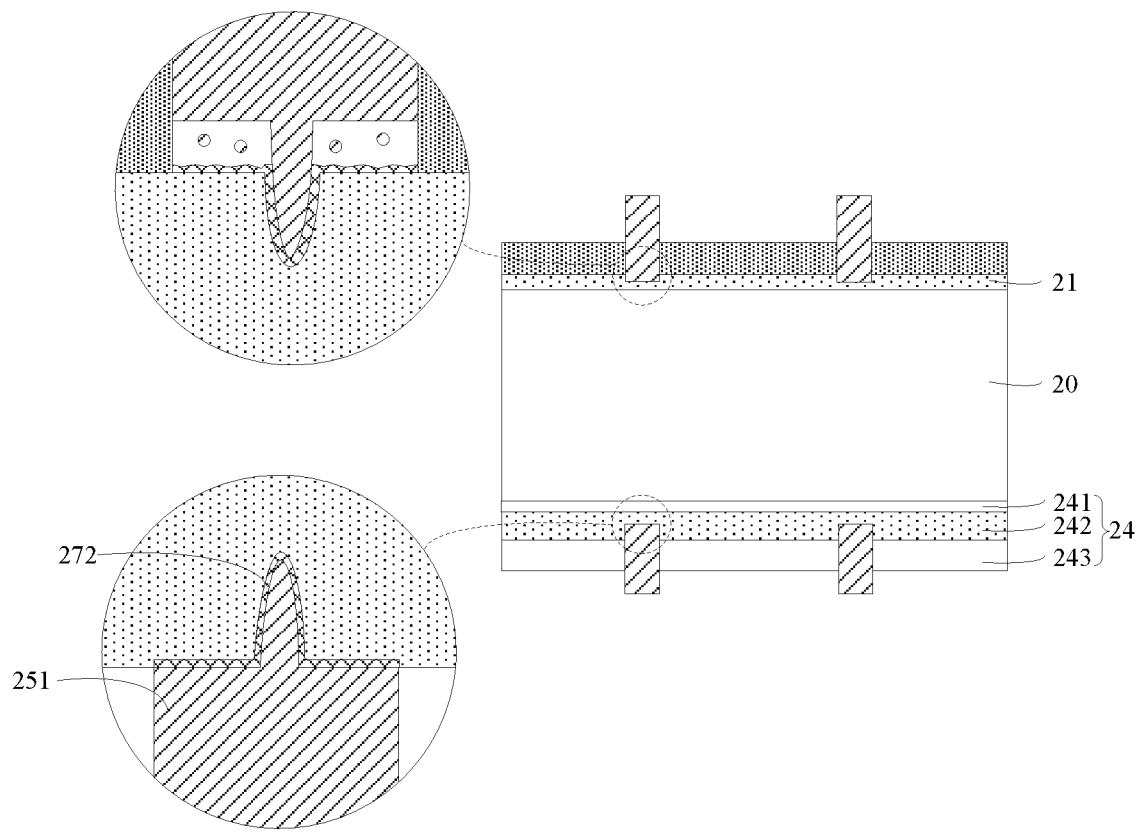

The material of part of the first crystal structure 131 and the material of part of the emitter 11 that are in contact are mixed to form a first eutectic 171, and the first eutectic 171 is at least partially located between the emitter 11 and the first crystal structure 131. For the PERC cell, a slot penetrating through the second passivation structure 14 is formed before the second electrode 15 is formed. The slot exposes the second surface of the substrate 10. The third crystal structure 151 formed subsequently penetrates through the second passivation structure 14 and is in contact with the substrate 10. The material of part of the third crystal structure 151 and the material of part of the substrate 10 that are in contact are mixed to form a second eutectic 172, and the second eutectic 172 is located between the third crystal structure 151 and the substrate 10. For the TOPCON cell, referring to FIG. 10, the third crystal structure 251 penetrates through the anti-reflective layer 243 and is in contact with the field passivation layer 242. The material of part of the third crystal structure 251 and the material of part of the field passivation layer 242 that are in contact are mixed to form the second eutectic 272, and the second eutectic 272 is located between the third crystal structure 251 and the field passivation layer 242. The third crystal structure 251 is electrically connected to the substrate 20 through the field passivation layer 242 and the interface passivation layer 241.

In some embodiments, an infrared-chain sintering furnace is used for rapid sintering performed on the first electrode 13 and the second electrode 15. Specifically, a semi-finished cell coated with the conductive paste is gradually sent into different sections, and temperatures of the different sections and residence time in the sections are controlled to adjust the electrical contact effect between the first electrode 13 and the second electrode 15 that are sintered.

Specifically, the conductive paste mainly consists of an organic vehicle, a conductive particle and a glass frit. Herein, the process of the sintering is described in detail by taking the conductive particle being a silver atom, the first passivation structure 12 being a silicon nitride single-layer structure and the material of the emitter 11 being silicon as examples. The sintering process may be divided into the following stages.

(1) In a drying stage, volatilization of an organic solvent in the organic vehicle mainly occurs. The higher the temperature, the faster the volatilization speed. The temperature is generally controlled at about 200° C.;

(2) In a combustion stage, combustion of an organic substance in the organic vehicle mainly occurs, such as a thickener, a thixotropic agent, a surfactant, a dispersant, etc. The temperature is generally controlled at 300 to 400° C.;

(3) In a sintering stage, the glass frit is softened first (the temperature is higher than a softening point of the glass frit). A molten glass frit dissolved with silver atoms is then deposited on a surface of the first passivation structure 12 and corrodes the silicon nitride layer under the action of PbO, so as to open a channel to make the silver atom contact with the emitter 11. Meanwhile, the silver atom undergoes processes such as rearrangement, condensation and electrode contraction under the action of the molten glass frit.

(4) In a cooling stage, a curing temperature of the glass frit is cooled to a room temperature. In this stage, regenerated silver particles grow on the surface of the emitter 11, and interdiffusion between the silver atoms and silicon atoms occurs at a silver-silicon contact interface to form a silver-silicon eutectic, thus realizing an ohmic contact between the first electrode 13 and the emitter 11 and conduction.

Herein, the sintering stage may be further divided into several sub-stages, and the temperatures and durations of the different sub-stages are as follows.

1. In an ablation stage, the sintering temperature is greater than 550° C. and less than 700° C., and the duration is 10 to 15 seconds. During this stage, components of the glass frit begin to dissolve and the fluidity is enhanced with the increasing of the sintering temperature. The glass frit starts to contact and corrode the silicon nitride layer while dissolving silver nanoparticles. Meanwhile, the silver nanoparticles are rearranged and the relative density of grid lines increases with the assistance of the molten liquid glass frit.

2. In a connection stage, the sintering temperature is greater than 700° C. and less than 850° C., and the duration is 10 to 20 seconds. During this stage, the regenerated silver particles starts to grow and are in contact with the emitter 11 to form the silver-silicon eutectic. The silver-silicon eutectic is conductive and may realize the current-collecting of the first electrode 13. Meanwhile, the silver particles continue to undergo processes such as rearrangement, condensation, electrode contraction, etc.

3. In a pre-cooling stage, the temperature is gradually reduced from 850° C. to 450° C. and the duration is 30 to 40 seconds. During this stage, the silver atoms dissolved in the glass frit are gradually precipitated on the surface of the emitter 11, appearing as an inverted pyramid silver microcrystal. The inverted pyramid silver microcrystal belongs to the first crystal structure 131. The first eutectic 171 isolates the inverted pyramid silver microcrystal from the emitter 11. The glass frit is solidified from a molten state to form a glass frit layer.

Figure 11:
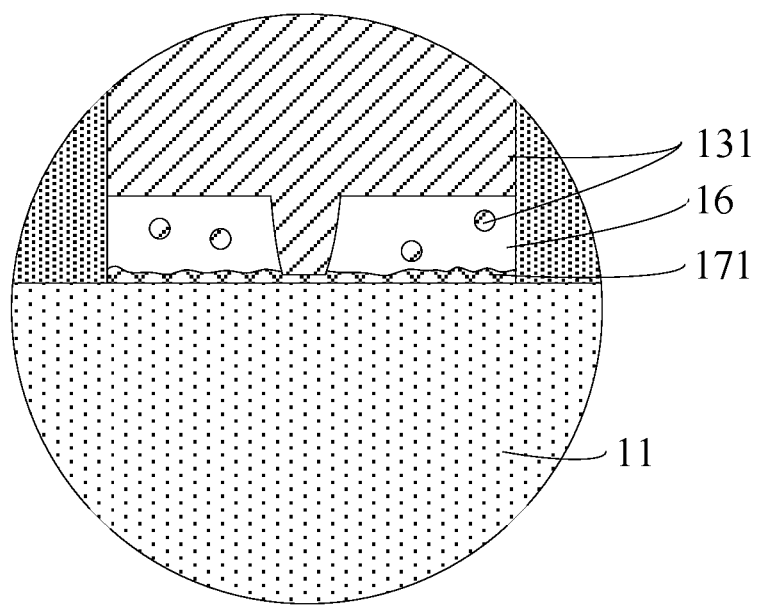

In some embodiments, the first crystal structure 131 penetrates through the first passivation structure 12 and is partially located in the emitter 11. The first eutectic 171 is also located in the emitter 11. In some embodiments, referring to FIG. 11, the first crystal structure 131 is located in the glass frit layer 16. The first eutectic 171 only covers the surface of the emitter 11, that is, the first eutectic 171 is not located in the emitter 11.

Referring to FIG. 1, a pulse voltage is applied to the first crystal structure 131 and the third crystal structure 151 by an external power supply, to form a second crystal structure 132 derived from the first crystal structure 131 and a fourth crystal structure 152 derived from the third crystal structure 151. The second crystal structure 132 penetrates through the first eutectic 171 and is in contact with the emitter 11. The first crystal structure 131 and the second crystal structure 132 constitute the first electrode 13. For the PERC cell, the fourth crystal structure 152 penetrates through the second eutectic 172 and is in contact with the substrate 10. The third crystal structure 151 and the fourth crystal structure 152 constitute the second electrode 15.

The external power supply may connect one of a positive electrode and a negative electrode to the first crystal structure 131 of the first electrode 13 and the other of the positive electrode and the negative electrode to the third crystal structure 151 of the second electrode 15, so as to simultaneously apply a voltage to the first crystal structure 131 and the third crystal structure 151. In this way, material atoms of the first crystal structure 131 and the third crystal structure 151 may be regenerated and recrystallized to form the derived second crystal structure 132 and fourth crystal structure 152.

In some embodiments, before the second crystal structure 132 is formed, a part of the first crystal structure 131 is located in the emitter 11, and the second crystal structure 132 is a derived structure of the part of the first crystal structure 131 located in the emitter 11. In some embodiments, a part of the first crystal structure is located in the emitter, and the second crystal structure is a derived structure of a part of the first crystal structure located in the glass frit layer. In some embodiments, the first crystal structure is located in the glass frit layer and does not extend into the emitter, and the second crystal structure is a derived structure of the first crystal structure located in the glass frit layer. The second crystal structure may contact the emitter either sequentially penetrating through the glass frit layer and the first eutectic, or only penetrating through the first eutectic.

In some embodiments, the photovoltaic cell is the TOPCON cell. The third crystal structure penetrates through the anti-reflective layer and is electrically connected to the field passivation layer. The second eutectic is located between the third crystal structure and the field passivation layer. The fourth crystal structure penetrates through the second eutectic and is in contact with the field passivation layer.

In some embodiments, the pulse voltage applied to the first crystal structure 131 and the third crystal structure 151 includes at least one of a triangular wave pulse voltage, a rectangular wave pulse voltage, a sawtooth wave pulse voltage and a triangular function wave pulse voltage.

Herein, a morphology of the second crystal structure 132 is related to the type and combination of the pulse voltage, and the number, branch strength and extension length (or bottom radius) of the second crystal structure 132 are related to the parameters of the pulse voltage. Specifically, the larger a range of electric potential of the pulse voltage, the higher a structural strength of the second crystal structure 132. The higher the frequency of the pulse voltage, the greater the number of the second crystal structures 132. The greater the number of cycles of the pulse voltage, the longer the extension length of the second crystal structure 132 or the larger the bottom radius. The characteristics of the fourth crystal structure 152 are similar to the characteristics of the second crystal structure 132, which are not repeated in detail here.

In some embodiments, the types and corresponding parameters of the pulse voltage are as follows:

| Parameters of triangular wave system | |
|---|---|
| Range of electric potential | −2 to 2 (V vs RHE), the optimal range of electric potential is −1 to 1 V |
| Scan rate | 0.05 to 1 V s$^{-1}$, the optimal scan rate is 0.1 V s$^{-1}$ |
| Starting phase | 0 (V vs RHE) |
| Termination phase | >−0.35 (V vs RHE) |
| Number of scan cycles | 10 to 100 times, the optimal number of scan cycles is 50 times |
| Parameters of rectangular wave system | |
| Range of electric potential (positive) | 0 to 2 (V vs RHE), the optimal potential is 0.8 V |
| Range of electric potential (negative) | −0.35 V < U < −2 V, the optimal potential is −1.2 V |
| Scan period | A single period is 0.2 to 10 seconds, the optimal scan period is 2 seconds |
| Scan positive period ratio | 20% to 40%, the optimal scan positive period ratio is 30% |
| Scan negative period ratio | 60% to 80%, the optimal scan negative period ratio is 70% |
| Starting phase | positive period |
| Number of scan cycles | 10 to 800 times, the optimal number of scan cycles is 40 times |
| Parameters of sawtooth wave system | |
| Range of electric potential | −2 to 2 (V vs RHE), the optimal range of electric potential is −1 to 1 V |
| Scan rate | 0.05 to 1 V s$^{-1}$, the optimal scan rate is 0.1 V s$^{-1}$ |
| Scan direction | Both positive and negative directions are available |
| Starting phase | 0 (V vs RHE) |
| Number of scan cycles | 10 to 100 times, the optimal number of scan cycles is 50 times |
| Parameters of triangular function wave system $y = A\sin(\omega t + \psi) + D$ | |
| Amplitude A | 0.35 to 2 (V vs RHE), the optimal amplitude is 1 V |
| Angular frequency $\omega$ | $0.2\pi$ to $10\pi$, the optimal angular frequency is $0.4\pi$ |
| Starting phase $\psi$ | 0 (V vs RHE) |
| DC offset D | −0.1 to 0.1 V, the optimal DC offset is 0 V |
| Number of scan cycles | 10 to 100 times, the optimal number of scan cycles is 50 times |

Herein, the structural strength of the second crystal structure 132 is controlled by controlling the range of the electric potential or the amplitude, so as to ensure that the second crystal structure 132 has a relatively high structural stability and avoid the fracture of the second crystal structure 132 when it is impacted or in the process of extension and growth. In addition, the higher the demand for the structural strength, the slower the extension and growth rate of the second crystal structure 132. Therefore, controlling the structural strength of the second crystal structure 132 is beneficial to shortening the growth time of the second crystal structure 132 and the processing time.

Correspondingly, the number of the second crystal structures 132 is controlled by controlling the scan rate, the scan period or the angular frequency, thereby avoiding a small area of the contact region caused by the excessively small number of the second crystal structures and overall epitaxy formed due to the excessively large number of the second crystal structures. In addition, the extension length or the bottom radius of the second crystal structure 132 is controlled by controlling the number of scan cycles, so as to avoid that the extension length of the second crystal structure 132 is too long or the bottom radius is too large to damage the characteristics of the emitter 11 on the basis of a relatively large area of the contact region between the second crystal structure 132 and the emitter 11, thus ensuring the photovoltaic cell having a relatively high photoelectric conversion efficiency.

In this embodiment, a part of the first electrode penetrates through the first eutectic and is in contact with the emitter. Compared with forming an ohmic contact with the substrate through the first eutectic, the first electrode is in a direct contact with the emitter, which is beneficial to reducing a contact resistance between the first electrode and the emitter, thus improving the current-collecting capability of the first electrode. Meanwhile, carriers may directly reach the first electrode without passing through the first eutectic, which is beneficial to reducing the recombination of carriers caused by surface defects and internal defects of the first eutectic, thus improving the photoelectric conversion efficiency.

Those skilled in the art should appreciate that the aforementioned embodiments are specific embodiments for implementing the present disclosure. In practice, however, various changes may be made in the forms and details of the specific embodiments without departing from the spirit and scope of the present disclosure. Person skilled in the art may make their own changes and modifications without departing from the spirit and scope of the present disclosure, so the protection scope of the present disclosure shall be subject to the scope defined by the claims.

What is claimed is:

1. A photovoltaic cell, comprising:
a substrate, and an emitter and a first passivation structure that are located on a first surface of the substrate, wherein the emitter is located between the substrate and the first passivation structure;
a first electrode, penetrating through the first passivation structure and being in contact with the emitter;
a first eutectic, located between the first electrode and the emitter, wherein the first eutectic includes a material of the first electrode and a material of the emitter, and a part of the first electrode penetrates through the first eutectic and is in contact with the emitter; and
a second passivation structure and a second electrode that are located on a second surface of the substrate, wherein the second electrode penetrates through the second passivation structure and is electrically connected to the substrate;
wherein the first electrode includes a first crystal structure and a second crystal structure, wherein the second crystal structure is a derived structure of the first crystal structure, the first eutectic is at least partially located between the emitter and the first crystal structure, and the second crystal structure penetrates through the first eutectic and is in contact with the emitter;
wherein a morphology of the second crystal structure includes a multi-bifurcating structure; and
wherein the second passivation structure includes an interface passivation layer, a field passivation layer and an anti-reflective layer that are arranged in sequence, and the second electrode penetrates through the anti-reflective layer and extends into the field passivation layer to be in contact with the field passivation layer and be electrically connected to the substrate;
the photovoltaic cell further comprising:
a second eutectic, located between the second electrode and the field passivation layer, wherein the second eutectic includes a material of the second electrode and a material of the field passivation layer;
wherein the second electrode includes a third crystal structure and a fourth crystal structure; and wherein the fourth crystal structure is a derived structure of the third crystal structure, the second eutectic is located between the third crystal structure and the field passivation layer, and the fourth crystal structure penetrates through the second eutectic and is in contact with the field passivation layer.

2. The photovoltaic cell according to claim 1, wherein a part of the first crystal structure is located in the emitter, and the second crystal structure is a derived structure of the part of the first crystal structure located in the emitter, and wherein the second crystal structure is located in the emitter.

3. The photovoltaic cell according to claim 1, wherein the first electrode further includes a glass frit layer, wherein the glass frit layer is located between the emitter and the first crystal structure, a part of the first crystal structure is located in the glass frit layer, the first eutectic is located between the glass frit layer and the emitter, and the second crystal structure sequentially penetrates through the glass frit layer and the first eutectic and is in contact with the emitter.

4. The photovoltaic cell according to claim 1, wherein the first electrode further includes a glass frit layer, wherein the glass frit layer is located between the emitter and the first crystal structure, a part of the first crystal structure is located in the glass frit layer, the first eutectic is located only on one side of the emitter, a bottom surface of the first crystal structure is in contact with the first eutectic, and the second crystal structure extends from the bottom surface of the first crystal structure to penetrate through the first eutectic and is in contact with the emitter without penetrating through the glass frit layer.

5. The photovoltaic cell according to claim 1, wherein the first crystal structure includes a plurality of protrusion portions with one or more voids between adjacent protrusion portions, wherein the second crystal structure fills the one or more voids between the adjacent protrusion portions.

6. The photovoltaic cell according to claim 1, wherein the second passivation structure includes an aluminum oxide layer and a hydrogen-doped silicon nitride layer that are arranged in sequence, and the second electrode penetrates through the hydrogen-doped silicon nitride layer and the aluminum oxide layer in sequence and is in contact with the substrate.

7. A photovoltaic module, comprising:
a cell string, formed by connecting a plurality of photovoltaic cells;
an encapsulation film, configured to cover a surface of the cell string; and
a cover plate, configured to cover a surface of the encapsulation film facing away from the cell string;
wherein each of the plurality of photovoltaic cells comprises:
a substrate, and an emitter and a first passivation structure that are located on a first surface of the substrate, wherein the emitter is located between the substrate and the first passivation structure;
a first electrode, penetrating through the first passivation structure and being in contact with the emitter;
a first eutectic, located between the first electrode and the emitter, wherein the first eutectic includes a material of the first electrode and a material of the emitter, and a part of the first electrode penetrates through the first eutectic and is in contact with the emitter; and
a second passivation structure and a second electrode that are located on a second surface of the substrate, wherein the second electrode penetrates through the second passivation structure and is electrically connected to the substrate;
wherein the first electrode includes a first crystal structure and a second crystal structure, wherein the second crystal structure is a derived structure of the first crystal structure, the first eutectic is at least partially located between the emitter and the first crystal structure, and the second crystal structure penetrates through the first eutectic and is in contact with the emitter; and
wherein a morphology of the second crystal structure includes a multi-bifurcating structure; and
wherein the second passivation structure includes an interface passivation layer, a field passivation layer and an anti-reflective layer that are arranged in sequence, and the second electrode penetrates through the anti-reflective layer and extends into the field passivation layer to be in contact with the field passivation layer and be electrically connected to the substrate;
each of the plurality of photovoltaic cells further comprising:
a second eutectic, located between the second electrode and the field passivation layer, wherein the second eutectic includes a material of the second electrode and a material of the field passivation layer;
wherein the second electrode includes a third crystal structure and a fourth crystal structure; and wherein the fourth crystal structure is a derived structure of the third crystal structure, the second eutectic is located between the third crystal structure and the field passivation layer, and the fourth crystal structure penetrates through the second eutectic and is in contact with the field passivation layer.

8. A method for manufacturing a photovoltaic cell, comprising:

providing a substrate, and an emitter and a first passivation structure that are located on a first surface of the substrate, wherein the emitter is located between the substrate and the first passivation structure; and forming a first electrode, the first electrode penetrating through the first passivation structure and being in contact with the emitter;

forming a first eutectic located between the first electrode and the emitter, wherein the first eutectic includes a material of the first electrode and a material of the emitter, and a part of the first electrode penetrates through the first eutectic and is in contact with the emitter; and forming a second passivation structure and a second electrode on a second surface of the substrate, wherein the second electrode penetrates through the second passivation structure and is electrically connected to the substrate;

wherein the first electrode includes a first crystal structure and a second crystal structure, wherein the second crystal structure is a derived structure of the first crystal structure, the first eutectic is at least partially located between the emitter and the first crystal structure, and the second crystal structure penetrates through the first eutectic and is in contact with the emitter;

wherein a morphology of the second crystal structure comprises a multi-bifurcating structure;

wherein the second passivation structure includes an interface passivation layer, a field passivation layer and an anti-reflective layer that are arranged in sequence, and the second electrode penetrates through the anti-reflective layer and extends into the field passivation layer to be in contact with the field passivation layer and be electrically connected to the substrate;

the method further comprising:

forming a second eutectic located between the second electrode and the field passivation layer, wherein the second eutectic includes a material of the second electrode and a material of the field passivation layer;

wherein the second electrode includes a third crystal structure and a fourth crystal structure; and wherein the fourth crystal structure is a derived structure of the third crystal structure, the second eutectic is located between the third crystal structure and the field passivation layer, and the fourth crystal structure penetrates through the second eutectic and is in contact with the field passivation layer.

9. The method according to claim 8, wherein forming the first electrode comprises:

forming the first crystal structure of the first electrode; and forming the second crystal structure from the first crystal structure;

wherein a part of the first crystal structure is located in the emitter, and the second crystal structure is a derived structure of the part of the first crystal structure located in the emitter, wherein both the second crystal structure and the part of the first crystal structure are present in the emitter.

10. The method according to claim 8, wherein the first electrode further includes a glass frit layer, wherein the glass frit layer is located between the emitter and the first crystal structure, a part of the first crystal structure is located in the glass frit layer, the first eutectic is located between the glass frit layer and the emitter, and the second crystal structure sequentially penetrates through the glass frit layer and the first eutectic and is in contact with the emitter.

11. the second passivation structure includes an aluminum oxide layer and a hydrogen-doped silicon nitride layer that are arranged in sequence, and the second electrode penetrates through the hydrogen-doped silicon nitride layer and the aluminum oxide layer in sequence and is in contact with the substrate; or the second passivation structure includes an interface passivation layer, a field passivation layer and an anti-reflective layer that are arranged in sequence, and the second electrode penetrates through the anti-reflective layer and extends into the field passivation layer to be in contact with the field passivation layer and be electrically connected to the substrate.

* * * * *